United States Patent
Koide

(10) Patent No.: US 7,854,498 B2
(45) Date of Patent: Dec. 21, 2010

(54) PIEZOELECTRIC ACTUATOR

(75) Inventor: Shohei Koide, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 202 days.

(21) Appl. No.: 12/324,012

(22) Filed: Nov. 26, 2008

(65) Prior Publication Data

US 2009/0141092 A1    Jun. 4, 2009

(30) Foreign Application Priority Data

Nov. 30, 2007   (JP) .............................. 2007-310889

(51) Int. Cl.
*B41J 2/045* (2006.01)
(52) U.S. Cl. ....................................... 347/72
(58) Field of Classification Search .................. 347/72, 347/68–69, 70–71; 310/311, 324, 358, 360; 400/124.14, 124.16
See application file for complete search history.

(56) References Cited

U.S. PATENT DOCUMENTS 7,578,579 B2 *   8/2009   Sugahara ...................... 347/71

2008/0239018 A1 *   10/2008   Sekiguchi ...................... 347/70

FOREIGN PATENT DOCUMENTS

JP        2005-27403         1/2005

* cited by examiner

*Primary Examiner*—K. Feggins
(74) *Attorney, Agent, or Firm*—Frommer Lawrence & Haug LLP

(57) ABSTRACT

A piezoelectric actuator includes a vibration plate, a first piezoelectric layer formed on one surface of the vibration plate, a second piezoelectric layer stacked on a surface of the first piezoelectric layer, a plurality of individual electrodes arranged on a surface of the second piezoelectric layer in a predetermined direction, a first common electrode having a plurality of first electrodes formed between the first piezoelectric layer and the second piezoelectric layer, and which are arranged in the predetermined direction to face the individual electrodes respectively, and a first wire electrically connecting all of the first electrodes, and a second common electrode having a plurality of second electrodes formed between the vibration plate and the first piezoelectric layer, and which are arranged in the predetermined direction to face the individual electrodes respectively, and a second wire electrically connecting all of the second electrodes.

7 Claims, 16 Drawing Sheets

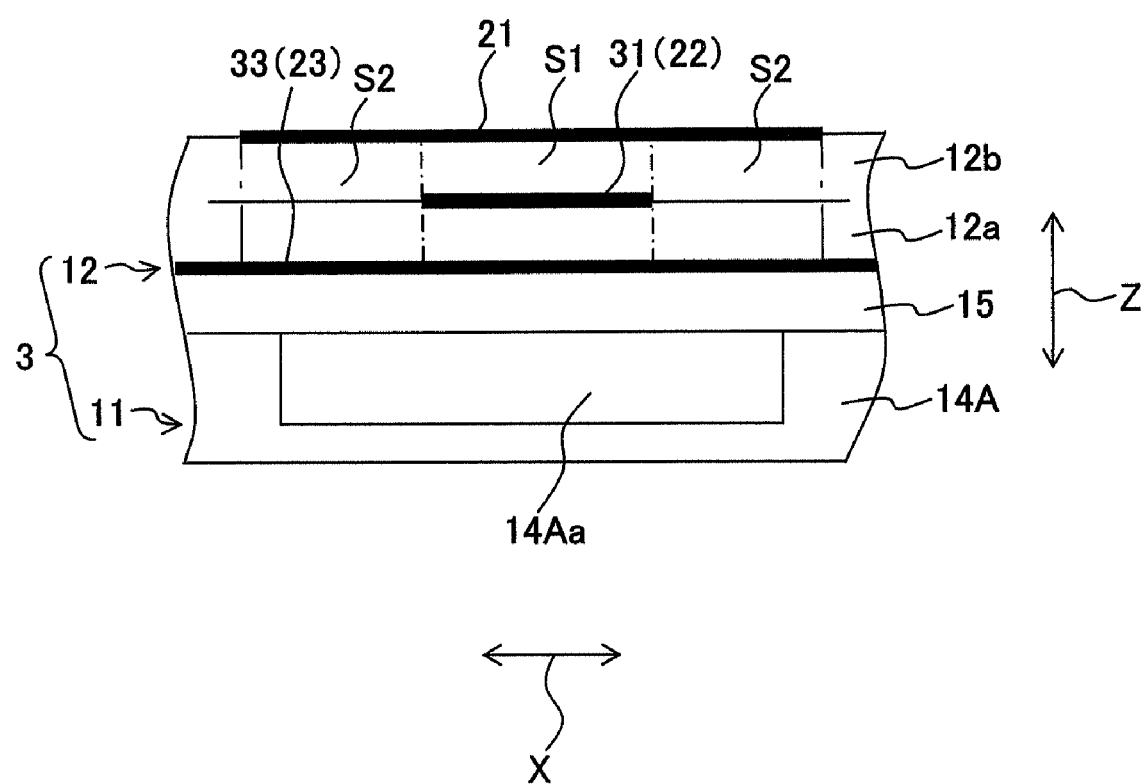

PIEZOELECTRIC ACTUATOR

CROSS REFERENCE TO RELATED APPLICATION

The present application claims priority from Japanese Patent Application No. 2007-310889, filed on Nov. 30, 2007, the disclosure of which is incorporated herein by reference in its entirety.

BACKGROUND OF THE INVENTION

1. Field of the Invention

The present invention relates to a piezoelectric actuator in which an active portion is deformed when a voltage is applied.

2. Description of the Related Art

As a piezoelectric actuator, an actuator which has a plurality of stacked piezoelectric layers, a common electrode arranged between the piezoelectric layers, and a plurality of individual electrodes arranged on an upper surface of the uppermost piezoelectric layer has been known.

In such a type of piezoelectric actuator, the common electrode is formed by applying an electrode material on an entire surface of the piezoelectric layer. Moreover, terminals for the individual electrodes are provided on the uppermost piezoelectric layer, corresponding to the individual electrodes respectively. Furthermore, each of the terminals for individual electrodes is provided to be in an electrical conduction with one of the individual electrodes, and is electrically connected to a drive circuit for applying selectively a drive voltage to the individual electrodes, via wires formed in an FPC (Flexible Printed Circuit)

In such piezoelectric actuator, an area between each of the individual electrodes and the common electrode acts as an active area, and when an electric field is applied to the active portion, the active portion is deformed independently. In other words, by the drive voltage being applied to the individual electrode from the drive circuit via the terminal for the individual electrode (hereinafter, 'individual electrode terminal'), an electric field is generated between the individual electrode and the common electrode, and the active portion between the individual electrode and the common electrode is deformed (refer to Japanese Patent Application Laid-open No. 2005-27403). In the piezoelectric actuator having such structure, a high densification of the individual electrodes has been sought to reduce a size of the piezoelectric actuator. However, when the individual electrodes are arranged highly densely, at the time of deformation of the active portion, a problem of cross-talk, in which a vibration of the active portion affects an adjacent active portions, becomes remarkable.

The common electrode in the piezoelectric actuator described in Japanese Patent Application Laid-open No. 2005-27403 is formed by applying an electrode material on the entire surface of the piezoelectric layer. Coefficient of linear expansion of the electrode materials forming the common electrode in the piezoelectric actuator described in Japanese Patent Application Laid-open No. 2005-27403 is different from a coefficient of linear expansion of the piezoelectric material such as PZT (lead zirconium titanate) forming the piezoelectric layer. Accordingly, the piezoelectric layer might bend by warping at the time of baking, or the piezoelectric layer might not bend but a residual stress after baking might increase.

By forming the common electrode described in Japanese Patent Application Laid-open No. 2005-27403 on the entire surface of the piezoelectric layer, a floating capacitance which does not contribute to the deformation of the active portion is generated between the common electrode and the individual electrode terminal. Since the floating capacitance generates heat, if the capacitance becomes greater, an amount of heat generated by the piezoelectric actuator increases.

SUMMARY OF THE INVENTION

An object of the present invention is to provide a piezoelectric actuator in which, the curling of the piezoelectric layer at the time of baking and the residual stress of the piezoelectric layer after the baking are small, and the amount of heat generated is small.

According to a first aspect of the present invention, there is provided a piezoelectric actuator including: a vibration plate; a first piezoelectric layer which is formed on one surface of the vibration plate; a second piezoelectric layer which is stacked on a surface of the first piezoelectric layer, the surface being on a side not facing the vibration plate; a plurality of individual electrodes which are formed on a surface, of the second piezoelectric layer, on a side not facing the first piezoelectric layer and which are arranged in a predetermined direction; a first common electrode which is formed between the first piezoelectric layer and the second piezoelectric layer, and which has a plurality of first electrodes arranged in the predetermined direction to face the individual electrodes respectively, and a first wire electrically connecting all of the first electrodes; and a second common electrode which is formed between the vibration plate and the first piezoelectric layer, and which has a plurality of second electrodes arranged in the predetermined direction to face the individual electrodes respectively, and a second wire electrically connecting all of the second electrodes; wherein the first wire and the second wire extend in the predetermined direction, and are arranged not to overlap with each other in a stacking direction of the first piezoelectric layer and the second piezoelectric layer. Here, "in a plan view" means looking in a direction opposite to a direction in which the second piezoelectric layer is provided with respect to the first piezoelectric layer.

According to the first aspect of the present invention, between the vibration plate and the first piezoelectric layer, an area in which the second common electrode is provided becomes small. Accordingly, it is possible to suppress a curling of the vibration plate and the first piezoelectric layer which is due to a difference between a coefficient of linear expansion of the vibration plate and a coefficient of linear expansion of the second common electrode, and a difference between a coefficient of linear expansion of the first piezoelectric layer and a coefficient of linear expansion of the second piezoelectric layer at the time of baking, and to reduce a residual stress of the piezoelectric actuator after baking. Moreover, by reducing the area in which the second common electrode is provided, it is possible to reduce an amount of an electrode material to be applied.

Moreover, in the present invention, since the first wire and the second wire do not overlap mutually in a plan view, it is possible to reduce a floating capacitance which is generated between the first wire and the second wire. Accordingly, it is possible to suppress heat generated due to the generation of the floating capacitance, and to suppress the amount of heat generated by the piezoelectric actuator.

In the piezoelectric actuator of the present invention, each of the first electrodes may be formed to be smaller than one of the individual electrodes to which each of the first electrodes faces and to be smaller than one of the second electrodes to which one of the individual electrodes faces, and each of the first electrodes may be entirely overlapped with one of the second electrodes and one of the individual electrodes in the stacking direction. In this case, a portion located between each of the individual electrodes and one of the first electrodes to which each of the individual electrodes faces acts as a first active portion, and a portion located between each of the individual electrodes and one of the second electrodes to which each of the individual electrodes faces, and located on an outer side of the first active portion acts as a second active portion. A first electric potential and a second electric potential which are different from each other are applied to the first electrode and the second electrode respectively. By applying the first electric potential and the second electric potential selectively to each of the individual electrodes, the first active portion and the second active portion corresponding to the individual electrode to which the electric potential is applied are deformed in opposite directions according to a voltage applied to each of the individual electrodes. Accordingly, the first active portion and the second active portion negate the deformations each other. Accordingly, a so-called cross-talk in which the deformations of the first active portion and the second active portion have an effect on deformations of the adjacent first active portion and the second active portion is suppressed.

In the piezoelectric actuator of the present invention, each of the second electrodes may be formed to be greater than one of the individual electrodes to which each of the second electrodes faces, and each of the individual electrodes may be entirely overlapped with one of the second electrodes in the stacking direction.

In the piezoelectric actuator of the present invention, the first wire may be arranged not to overlap, in the stacking direction, with an individual electrode arrangement area including individual electrode areas in which the individual electrodes are arranged in the predetermined direction and a connecting area which connects the individual electrode areas in the predetermined direction; and the second wire may be arranged to overlap with the individual electrode arrangement area in the stacking direction. In this case, it is possible to arrange the first wire and the second wire not to overlap with each other. Accordingly, it is possible to decrease a floating capacitance which is generated between the first wire and the second wire. As a result, it is possible to suppress a heat generation due to the generation of the floating capacitance, and to suppress the amount of heat generated by the piezoelectric actuator.

The piezoelectric actuator of the present invention may further include a plurality of individual electrode terminals which are electrically connected to a voltage applying mechanism which applies a voltage selectively to the individual electrodes, and which are electrically connected to the individual electrodes respectively; and the individual electrode terminals may be provided on a surface of the second piezoelectric layer, on a side not facing the first piezoelectric layer, at one of side portions, in an orthogonal direction orthogonal to the predetermined direction, of the individual electrode arrangement area; and the first wire may be provided at the other side portion, in the orthogonal direction, of the individual electrode arrangement area. In this case, it is possible to apply the voltage selectively by the voltage applying mechanism to each of the individual electrodes via each of the individual electrode terminals. Moreover, the individual electrode terminals, the first wire and the second wire are arranged not to overlap with each other in a plan view. Accordingly, it is possible to decrease the floating capacitance which is generated between the individual electrode terminals, the first wire and the second wire. As a result, it is possible to suppress the heat generated due to the generation of the floating capacitance, and to suppress the heat amount generated by the piezoelectric actuator.

In the piezoelectric actuator of the present invention, in the predetermined direction, an area in which the second electrodes are formed may be greater than an area in which the second wire is formed. In this case, it is possible to reduce the area in which the second wire is formed. Accordingly it is possible to suppress further the curling of the vibration plate and the first piezoelectric layer at the time of baking, and to reduce further the residual stress of the piezoelectric actuator after baking.

In the piezoelectric actuator of the present invention, the actuator may be electrically connected to a voltage applying mechanism which selectively applies a first electric potential and a second electric potential different from the first electric potential to the individual electrodes, and which applies the first electric potential to the first electrodes via the first wire, and which applies the second electric potential to the second electrodes via the second wire; and in the second piezoelectric layer, portions, each located between one of the individual electrodes and one of the first electrodes to which one of the individual electrodes faces, may form first active portions respectively; in the first piezoelectric layer and the second piezoelectric layer, portions, each located between one of the individual electrodes and one of the second electrodes to which one of the individual electrodes faces may form second active portions respectively, the portions not including the first active portions and portions between the first electrodes and the second electrodes; and when the second electric potential is applied to the individual electrodes, the first active portions may extend in the stacking direction and may be contracted in an orthogonal direction orthogonal to the stacking direction, and when the first electric potential is applied to the individual electrodes, the second active portions may extend in the stacking direction and may be contracted in the orthogonal direction. In this case, when the first electric potential is applied to each of the individual electrodes, the first active portions are deformed, and the second active portions are not deformed. Moreover, when the second electric potential is applied to each of the individual electrodes, the first active portions are not deformed, and the second active portions are deformed. In this manner, even when any of the first electric potential and the second electric potential is applied to each of the individual electrodes, since one of the first active portions and the second active portions are not deformed, the deformations of one of the first active portions and the second active portions can negate the deformations of the other active portions. Consequently, even when the adjacent individual electrodes come closer by arranging the individual electrodes highly densely, the deformations of the first active portions are negated by the second active portions arranged on the outer side of the first active portions, and the so-called cross-talk in which there is an effect on the adjacent first active portions is suppressed.

BRIEF DESCRIPTION OF THE DRAWINGS

FIG. 4 is a cross-sectional view of the ink-jet head shown in FIG. 2 along a line IV-IV in FIG. 2 in which a part of the ink-jet head shown is seen in an enlarged form;

DETAILED DESCRIPTION OF THE PREFERRED EMBODIMENTS

Exemplary embodiments of the present invention will be described below while referring to the accompanying diagrams.

First Embodiment

Figure 1A:
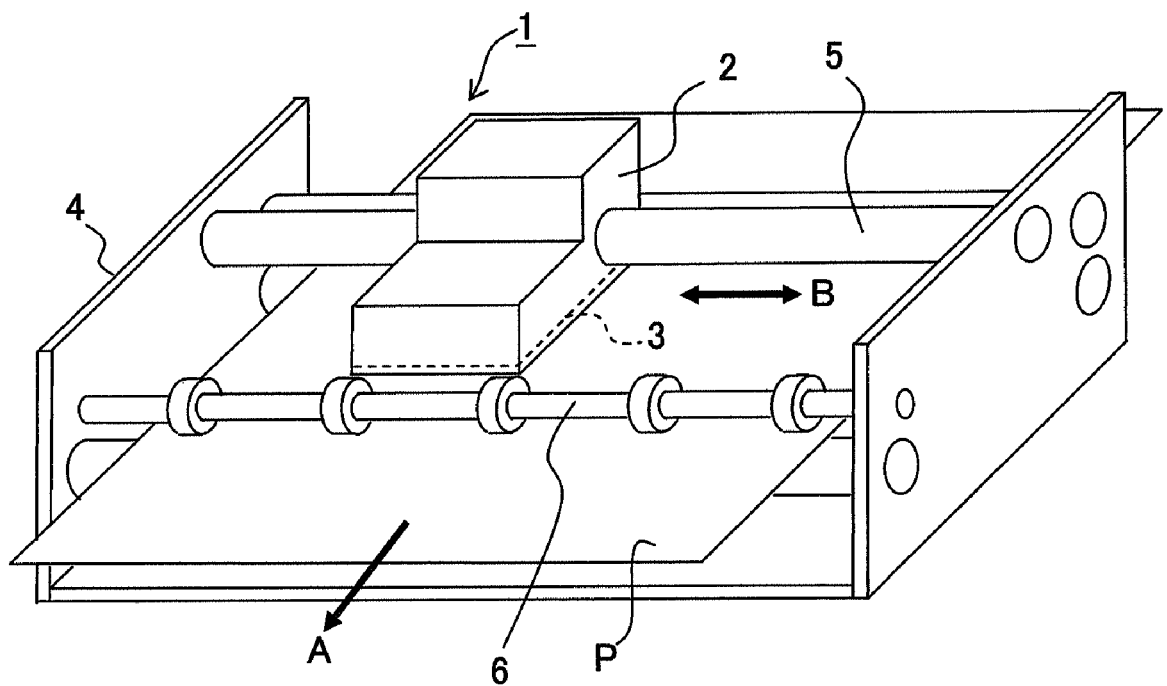
FIG. 1A is a schematic structural view showing a schematic structure of an ink-jet printer (liquid droplet jetting apparatus) according to the present invention.
Figure 1B:
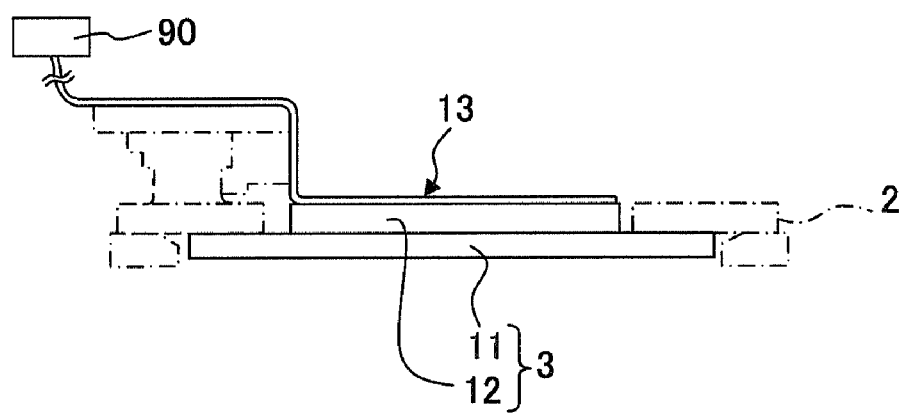
FIG. 1B is a diagram showing a relationship of a cavity unit, a piezoelectric actuator, and a flexible circuit board (COP) according to the present invention.

FIG. 1A is a schematic structural view showing a schematic structure of an ink-jet printer (liquid droplet jetting apparatus) according to the present invention, and FIG. 1B is a diagram showing a relationship of a cavity unit, a piezoelectric actuator, and a flexible circuit board (COP) according to the present invention.

An ink-jet printer 1 according to the present invention, as shown in FIG. 1A, is provided with an ink-jet head 3 (liquid droplet jetting head), for recording on a recording paper P (recording medium), on a lower surface of a carriage 2 on which an ink cartridge is mounted (not shown in the diagram). The carriage 2 is supported by a guide plate (not shown in the diagram) and a carriage shaft 5 provided inside a printer frame 4, and reciprocates in a direction B which is orthogonal to transporting direction A of the recording paper P. The recording paper P transported in the transporting direction A from a paper feeding section (not shown in the diagram) is introduced between a platen roller (not shown in the diagram) and the ink-jet head 3, and a predetermined recording is carried out by an ink jetted from the ink-jet head 3 toward the recording paper P. The recording paper P with an image etc. recorded thereon is thereafter discharged by a paper discharge roller 6.

Moreover, as shown in FIG. 1B, the ink-jet head 3 includes a channel unit 11 and a piezoelectric actuator 12 in order from a lower side, and a flexible circuit board 13 (signal wire) which supplies a drive signal is provided on an upper surface of the piezoelectric actuator 12.

Figure 2A:
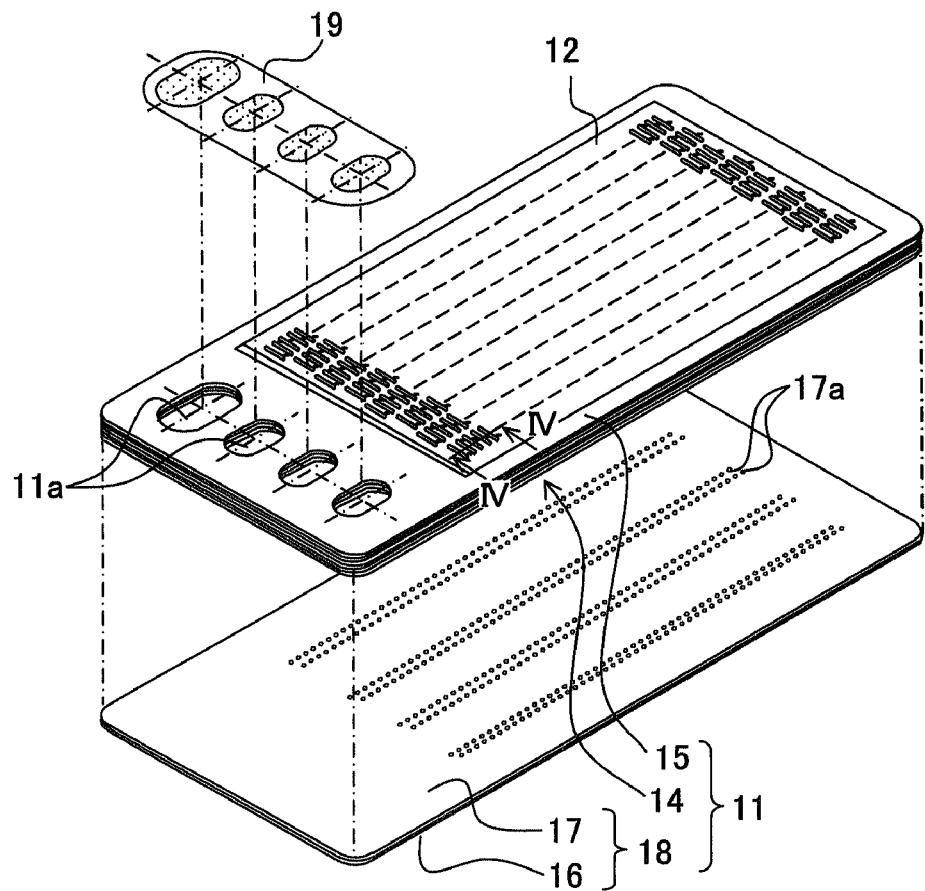
FIG. 2A and FIG. 2B are perspective views showing a state of the piezoelectric actuator adhered on an upper side of a channel unit.
Figure 3:
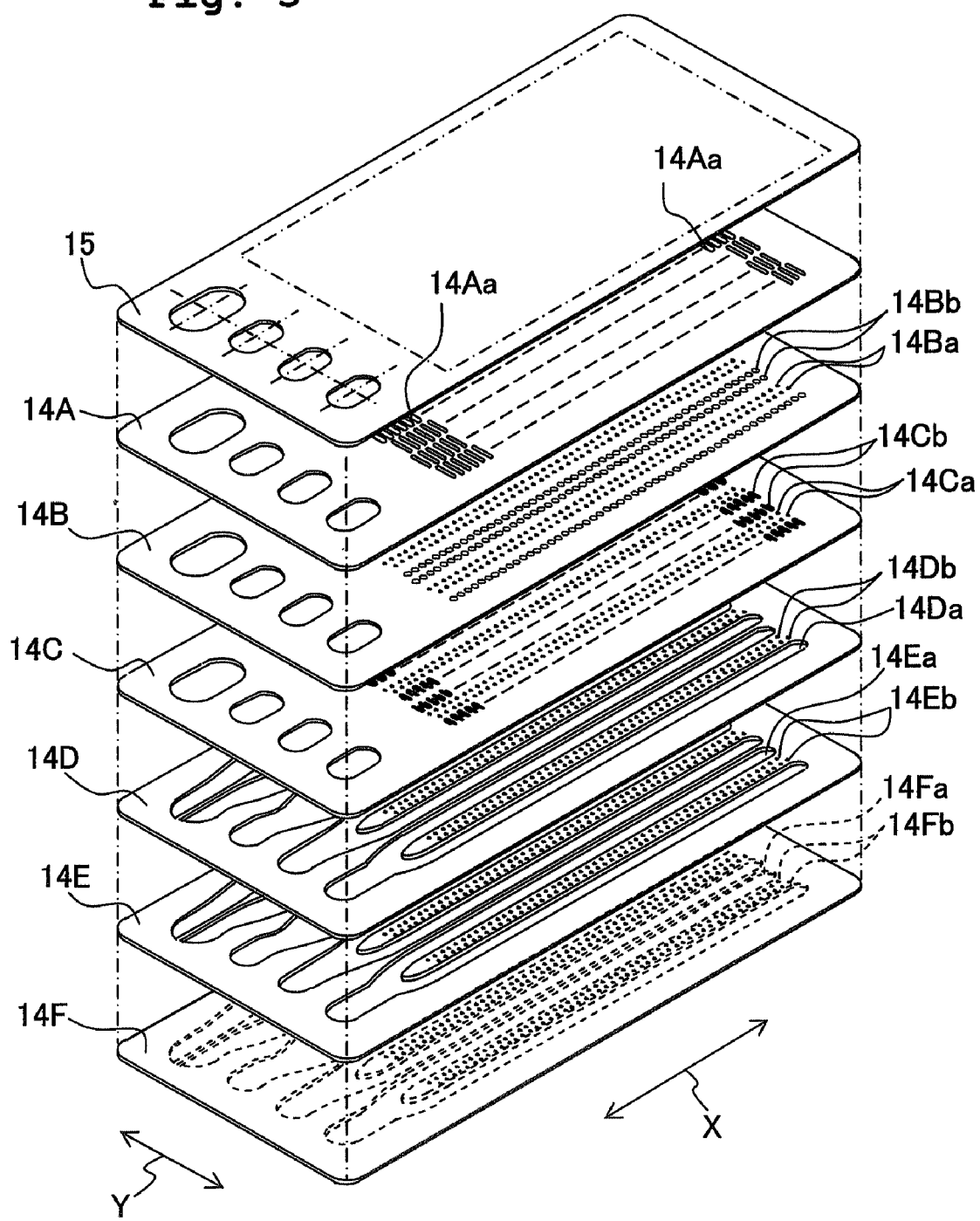
FIG. 3 is a diagram in which each plate which is a structural component of a stacked body included in the channel unit is disassembled, and shown along with a top plate.

FIG. 2A is a perspective view showing a state in which the piezoelectric actuator 12 is adhered on an upper side of the channel unit 11. FIG. 3 is a diagram in which plates 14A to 14F which are components of a stacked body 14 included in the channel unit 11 are disassembled, and shown with a top plate 15. The channel unit 11 is formed to be rectangular shaped, and as shown in FIG. 2A, includes the stacked body 14 which is formed of the plurality of plates. A vibration plate 15 included in the piezoelectric actuator 12 is placed on an upper side of the stacked body 14, and on a lower side of the stacked body 14, a plate assembly 18, which is formed by sticking a nozzle plate 16 in which nozzle holes 16a are formed and a spacer plate 17 in which through holes 17a communicating with the nozzle holes 16a respectively are formed, is adhered integrally. The piezoelectric actuator 12 for jetting an ink (a liquid) in pressure chambers 14Aa selectively is connected to an upper side of the vibration plate 15. Moreover, filters 19 for trapping dust etc. included in the ink are provided to openings 11a of the channel unit 11, respectively. The nozzle plate 16 is a plate, of a synthetic resin (such as polyimide), in which nozzle holes 16a communicating with the pressure chambers 14Aa of the cavity plate 14A (forming the stacked body 14) respectively are formed. The nozzle plate 16 may be a metallic plate. The nozzle holes 16a form a plurality of nozzle rows arranged in a short axis direction of the ink-jet head 3 (called as 'Y direction') and each of the nozzle rows extends in a longitudinal direction of the ink-jet head 3 (called as 'X direction').

The stacked body 14, as shown in FIG. 3, includes a cavity plate 14A, a base plate 14B, a supply plate 14C, two manifold plates 14D and 14E, and a damper plate 14F in order from an upper side, and these plates 14A to 14F are stacked and subjected to metal diffusion joining. These six plates 14A to 14F are stacked upon positioning mutually such that ink channels are formed for nozzle holes 16a respectively. The cavity plate 14A is a metallic plate in which a plurality of openings which define the plurality of pressure chambers 14Aa are formed regularly corresponding to a nozzle row. Concretely, the pressure chambers 14Aa form a plurality of pressure chamber rows corresponding to the nozzle rows respectively, and two rows for each colors of ink jetted from the ink-jet head 3 are arranged in the Y direction. In the embodiment, eight pressure chamber rows corresponding to inks of black, cyan, magenta, and yellow are arranged in the Y direction. The pressure chambers 14Aa in one pressure chamber row are arranged to be shifted in X direction with respect to the pressure chambers 14Aa in the adjacent pressure chamber rows. In other words, the pressure chambers 14Aa are arranged in a staggered form.

The base plate 14B is a metallic plate provided with communicating holes 14Ba which communicate manifolds 14Da and 14Ea (common ink chambers) and the pressure chambers 14Aa, and communicating holes 14Bb which communicate pressure chambers 14Aa and the nozzle holes 16a respectively. The supply plate 14C is a metallic plate in which communicating passages which communicate pressure chambers 14Aa and the manifolds 14Da and 14Ea respectively are formed as groove passages on an upper surface thereof, and communicating holes which communicate the manifolds 14Da and 14Ea (common ink chambers) and the pressure chambers 14Aa and communicating holes 14Cb which communicate pressure chambers 14Aa and the nozzle holes 16a respectively are formed.

The manifold plates 14D and 14E are metallic plates in which communicating holes 14Db and 14Eb which communicate pressure chambers 14Aa and the nozzle holes 16a are formed in addition to the manifolds 14Da and 14Ea. The damper plate 14F is a metallic plate in which communicating holes 14Fb which communicate the pressure chambers 14Aa and the nozzle holes 16a are formed in addition to damper chambers 14Fa which are formed as recesses on a lower surface thereof.

In this manner, the channel unit 11 includes the plurality of nozzle holes 16a, the plurality of pressure chambers 14Aa which communicate with the nozzle holes 16a respectively, and the manifolds 14Da and 14Ea which temporarily store ink to supply to the pressure chambers 14Aa.

Figure 2B:
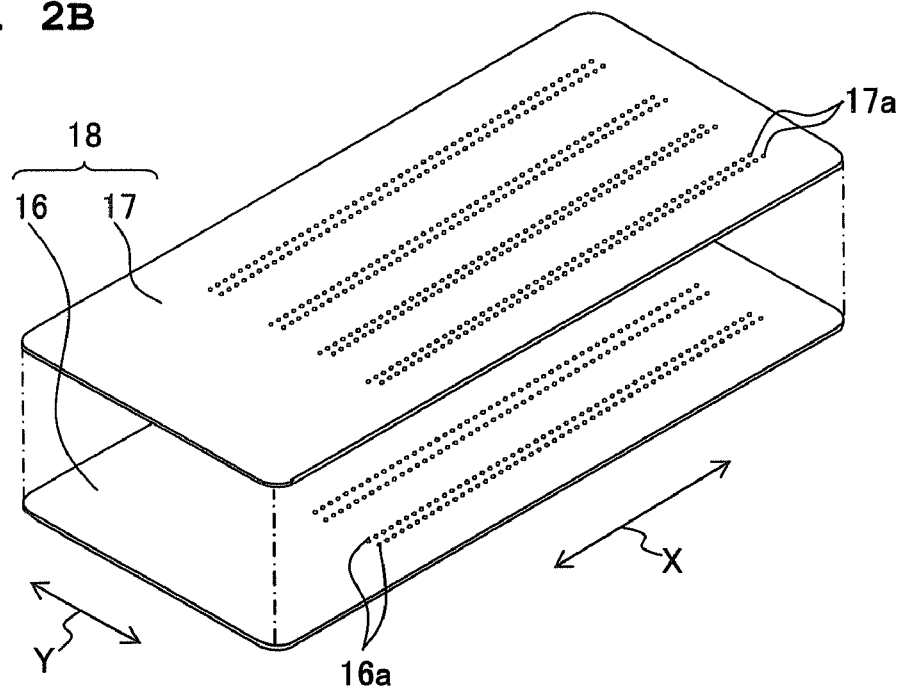

FIG. 4 is a cross-sectional view of the ink-jet head 3 shown in FIG. 2 along a line IV-IV in FIG. 2 (also shown in FIG. 5A which will be described later), in which a part of the ink-jet head 3 is shown in an enlarged form. As shown in FIG. 2, the piezoelectric actuator 12 is formed to be rectangular shaped, and a longitudinal direction thereof substantially coincides with X direction in FIG. 2 and a short axis direction thereof substantially coincides with Y direction in FIG. 2. The piezoelectric actuator 12, as shown in FIG. 4, has a first piezoelectric layer 12a and a second piezoelectric layer 12b. The first piezoelectric layer 12a is formed on one surface of the vibration plate 15, and the second piezoelectric layer 12b is formed on a surface, of the first piezoelectric layer 12a, not facing the vibration plate 15. By stacking the vibration plate 15, the first piezoelectric layer 12a, and the second piezoelectric layer 12b in such manner, the stacked piezoelectric actuator 12 is formed on the vibration plate 15. The first piezoelectric layer 12a and the second piezoelectric layer 12b are made of a ceramics material (piezoelectric sheet) of lead zirconium titanate (PZT) which has a ferroelectric property, and are polarized in a thickness direction thereof. The vibration plate 15 is formed of a metallic plate. However, the vibration plate 15 may be formed of a ceramics material (piezoelectric sheet) of lead zirconium titanate (PZT) which has a ferroelectric property similarly as the first piezoelectric layer 12a and the second piezoelectric layer 12b.

Figure 5A:
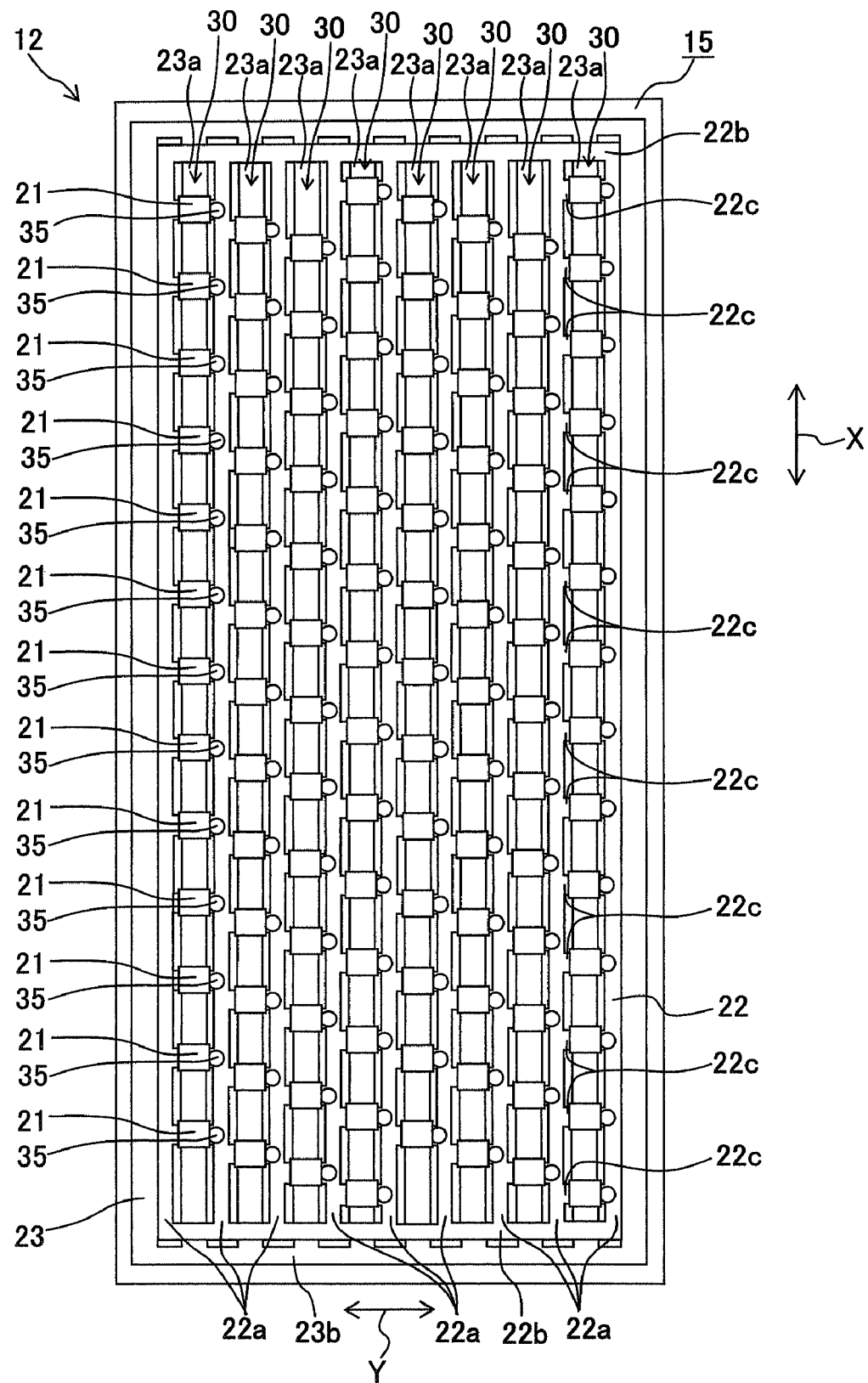
FIG. 5A is a plan view showing a state in which a first piezoelectric layer and a second piezoelectric layer are removed from a piezoelectric actuator of a first embodiment.
Figure 5B:
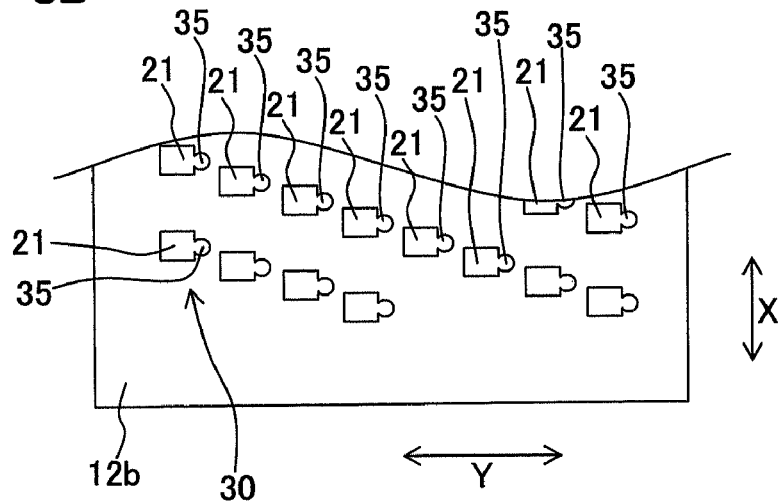
FIG. 5B is a plan view showing a state of a plurality of individual electrodes.
Figure 5C:
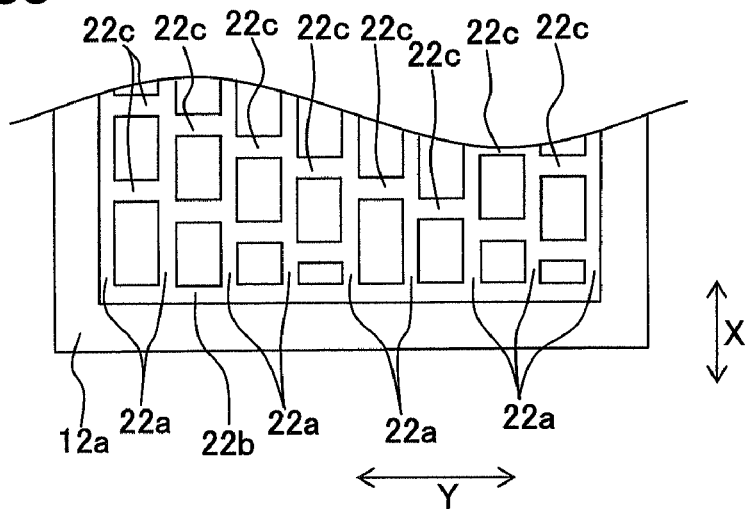
FIG. 5C is a plan view showing a state of a first common electrode.
Figure 5D:
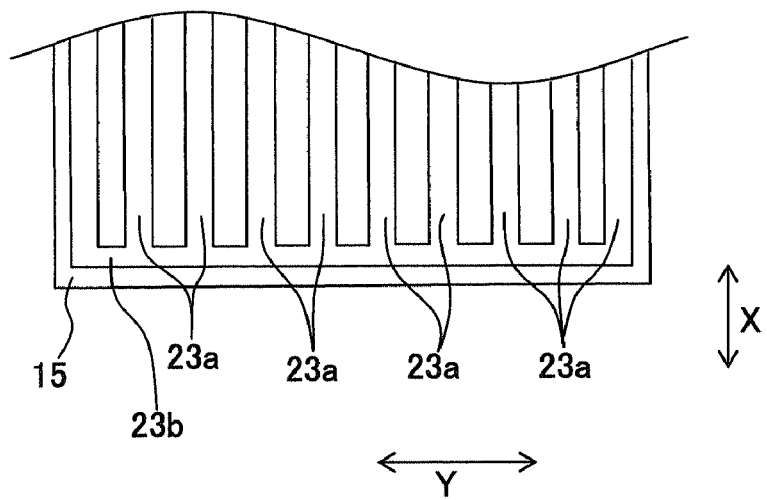
FIG. 5D is a plan view showing a state of a second common electrode.
Figure 6:
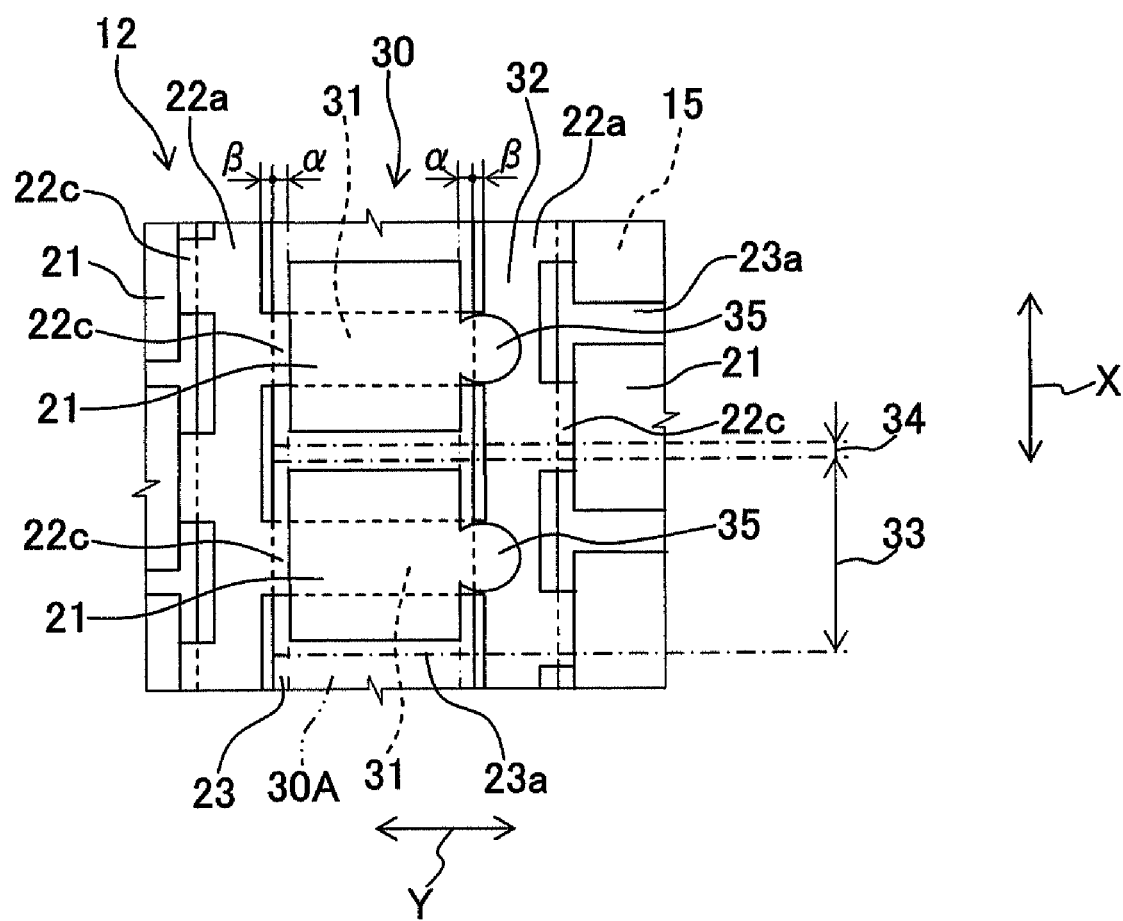
FIG. 6 is an enlarged plan view showing a portion of FIG. 5A in an enlarged formed.

FIG. 5A is a plan view showing a state in which the first piezoelectric layer 12a and the second piezoelectric layer 12b are removed from the piezoelectric actuator 12 of the first embodiment. FIG. 5B is a plan view showing a pattern of a plurality of individual electrodes 21, FIG. 5C is a plan view showing a pattern of a first common electrode 22, and FIG. 5D is a plan view showing a pattern of a second common electrode 23. Moreover, FIG. 6 is an enlarged plan view showing a part of FIG. 5A in an enlarged form. FIG. 5A, FIG. 5B, and FIG. 6 are plan views when seen the piezoelectric actuator 12 from which the first piezoelectric layer 12a and the second piezoelectric layer 12b are removed in a plan view. The piezoelectric actuator 12 further includes the plurality of individual electrodes 21, the first common electrode 22, and the second common electrode 23. Each individual electrode 21 is formed of a metallic material such as Ag—Pd. Moreover, each individual electrode 21 is arranged corresponding to one of the pressure chambers 14Aa of the channel unit 11, on a surface of the second piezoelectric layer 12b, on an opposite side of the first piezoelectric layer 12a, in other words, on an upper surface of the second piezoelectric layer 12b. The individual electrodes 21 are formed at least same number of the pressure chambers 14Aa on the upper surface of the second piezoelectric layer 12b. Concretely, the individual electrodes 21 are arranged on the corresponding pressure chambers 14Aa respectively, and form individual electrode rows 30 each of which extends in X direction. The individual electrode rows 30 (eight rows in the first embodiment) are arranged in Y direction, and the individual electrodes 21 in one of the individual electrode rows are shifted in X direction with respect to the individual electrodes 21 in the adjacent individual electrode rows 30 respectively. As a result, the individual electrodes 21 are arranged in a staggered form.

Terminals for the individual electrodes (hereinafter, 'individual electrode terminals') 35 are electrically connected to the individual electrodes 21 respectively. Each of the individual electrode terminals 35 is formed on one side, in Y direction (right side of paper surface in FIG. 5A, FIG. 5B, and FIG. 6), of one of the individual electrodes 21 as shown in FIG. 6, and is formed to be circular shaped in a plan view. A plurality of terminals not shown in the diagram are formed on the flexible circuit board 13 corresponding to the individual electrode terminals 35, and when the flexible circuit board 13 is connected to the piezoelectric actuator 12, the terminals are electrically connected to the individual electrode terminals 35.

The flexible circuit board 13 is electrically connected to a driver IC 90 (voltage applying mechanism) (refer to FIG. 1B) which supplies a drive signal. The driver IC 90 selectively applies to the individual electrodes 21 of the piezoelectric actuator 12, one of a first potential and a second electric potential which will be described later, as a drive signal, via the flexible circuit board 13.

The first common electrode 22 which is made of a metallic material such as Ag—Pd is provided between the first piezoelectric layer 12a and the second piezoelectric layer 12b (refer to FIG. 4), and has a plurality of first common wires 22a which extend in X direction. The first common wires 22a are arranged on both sides, in Y direction, of each of the individual electrode rows 30 in a plan view. One of the first common wires 22a is arranged between the adjacent individual electrode rows 30, and the adjacent individual electrodes 30 have the first common wire 22a commonly. Moreover, both ends, in X direction, of each of the first common wires 22a are electrically connected to a pair of second common wires 22b extending in Y direction respectively. Accordingly, an outer frame of the first common electrode 22 is formed to be substantially rectangular shaped. Moreover, the pair of second common wires 22b is electrically connected to the driver IC 90 via the flexible circuit board 13 by an electroconductive member which is filled in through holes not shown in the diagram and formed through the second piezoelectric layer 12b.

Moreover, a plurality of wires for first electrode (hereinafter, 'first electrode wires') 22c extending in Y direction is provided between two adjacent first common wires 22a. The first electrode wires 22c are provided at even intervals in X direction to be arranged corresponding to the individual electrodes 21 respectively. More concretely, as shown in FIG. 6, the first electrode wires 22c are arranged such that an intermediate portion of each of the wires 22c overlaps with one of the individual electrodes 21 corresponding to the wire 22c in a plan view. In the first common electrode 21, portions of the first electrode wires 22c with which the individual electrodes 21 overlap respectively form first electrodes 31, and the remaining portion of the first common electrode 21 (excluding the second common wires 22b) forms a first wire 32. In other words, the first common electrode 22 has the first electrodes 31 arranged in rows each of which extends in X direction, and the rows of the first electrodes 31 are arranged in Y direction, similarly as the individual electrodes 21. Further, the first common electrode 22 has the first wire 32 which is electrically connected with all of the first electrodes 31. A length of each of the first electrode wires 22c in X direction is shorter than a length of one of the corresponding individual electrodes 21 in X direction. Therefore, in a plan view, a size of the first electrode 31 is smaller than a size of the corresponding individual electrode 21.

The second common electrode 23 is made of a metallic material such as Ag—Pd, and is provided between the vibration plate 15 and the first piezoelectric layer 12a (refer to FIG. 4). The second common electrode 23, as shown in FIG. 5D, has a plurality of second electrode wires 23a each extending in X direction. The second electrode wires 23a are arranged to overlap with an individual electrode arrangement area 30A in which each of the individual electrode rows 30 is formed in a plan view, in other words, to overlap with the individual electrode arrangement area 30A including areas in which individual electrodes 21 of each individual electrode row 30 are formed, and an area connecting the areas in which the individual electrodes 21 are formed. Further, the second common electrode 23, as shown in FIG. 5A, has a wire 23b having a rectangular-frame shape arranged to surround the first common electrode 22 from four sides in a plan view, and both ends, in X direction, of the second electrode wires 23a are connected electrically to the wire 23b. The wire 23b is formed and arranged not to overlap with the first common electrode 22 in a plan view, and is electrically connected to the driver IC 90 via the flexible circuit board 13 by an electroconductive material filled in through holes formed through the first piezoelectric layer 12a and the second piezoelectric layer 12b.

In the second common electrode 23, portions, of the second electrode wires 23a, with which the individual electrodes 21 overlap respectively in a plan view form second electrodes 33 (a larger area out of two areas between long and short dashes lines in FIG. 6), and the remaining portion of the second common electrode 23 forms a second wire 34 (a smaller area out of the two areas between the long and short dashes lines). In other words, the second common electrode 23 has the second electrodes 33 arranged in rows each of which extends in X direction corresponding to the plurality of individual electrodes 21, and the rows are arranged in Y direction. Further, the second common electrode 23 has the second wire 34 which is electrically connected to all of the second electrodes 33. Portions, of the second wire 34, between the adjacent second electrodes 33 are arranged at even intervals in X direction. More concretely, each of the second electrode wires 23a is formed to have a length in Y direction to be longer than the length in Y direction of the individual electrode 21 overlapping with the second electrode wire 23a in a plan view, and the second electrode 33 is formed to be slightly larger in X direction and Y direction than the corresponding individual electrode 21 in a plan view. In other words, the second electrodes 33 are formed to be larger than the individual electrodes 21 respectively, and each of the individual electrodes 21 is entirely overlapped with one of the second electrodes 33 corresponding to the individual electrode 21.

The individual electrode 21, the first common electrode 22, and the second common electrode 23 formed as described above are arranged in order at regular positions and stacked as shown in FIG. 6. At the regular positions, in a plan view, a distance between one end in Y direction (left side in FIG. 6) of the individual electrode 21 and one end in Y direction of the second common electrode 23 with which the individual electrode 21 overlaps is same as a distance between the other end in Y direction (right side in FIG. 6) of the individual electrode 21 and the other end in Y direction of the second common electrode 23. This distance is about few tens of μm (hereinafter, α μm), and preferably 30 μm. Moreover, at the regular positions, a distance between one end in Y direction of the second common electrode 23 and the other end in Y direction (right side in FIG. 6) of the adjacent first common wire 22a and a distance between the other end in Y direction of the second common electrode 23 and one end in Y direction (left side in FIG. 6) of the adjacent first common wire 22a are equivalent. This distance is about few tens of μm (hereinafter, β μm).

It is preferable that each of the individual electrode 21, the first common electrode 22, and the second common electrode 23 is arranged at the regular position. However, if a position shift at the time of forming the individual electrode 21, or a position shift associated with baking occurs, the individual electrode 21, the first common electrode 22, and the second common electrode 23 might be arranged to be shifted from the regular positions. Therefore, by forming the second electrode 33 to be greater than the individual electrode 21 as described above, it is possible to tolerate the position shift of the individual electrode 21 with respect to the first common electrode 22 and the second common electrode 23 at the time of baking or forming the individual electrode 21. A state in which the individual electrode 21 has a position shift with respect to the first common electrode 22 or the second common electrode 23 will be described below by using FIG. 7A to FIG. 7D.

FIG. 7A to FIG. 7D are plan views showing states in which the individual electrode 21 and the first common electrode 22 are arranged being shifted from the regular positions respectively. FIG. 7A to FIG. 7D, similarly as FIG. 6, are plan views of states in which the first piezoelectric layer 12a and the second piezoelectric layer 12b are removed from the piezoelectric actuator 12.

Figure 7A:
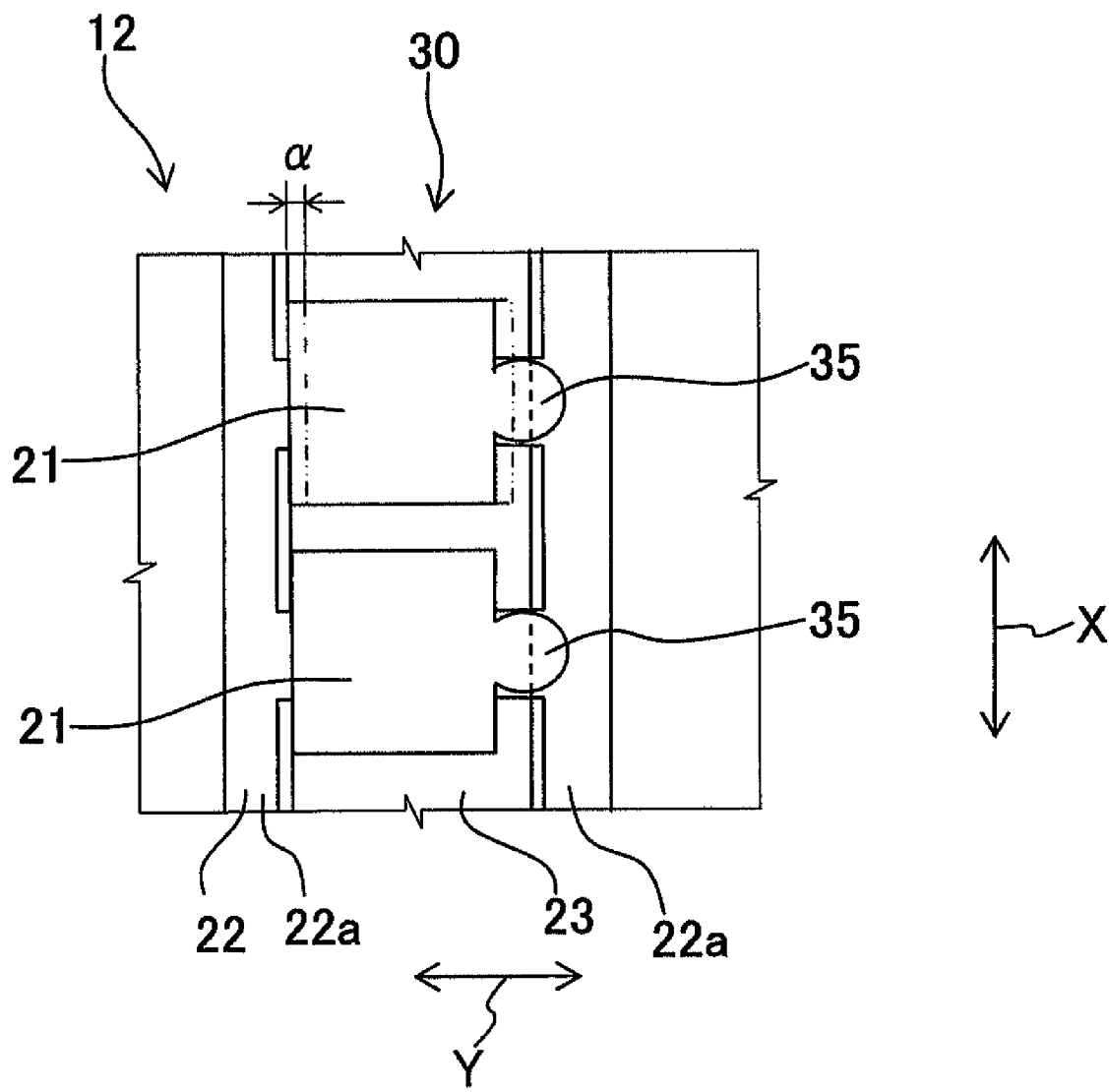
FIG. 7A is a plan view showing a state in which the individual electrode is shifted in Y direction (left side in FIG. 7A) from a regular position (alternate long and short dashes lines)
Figure 7B:
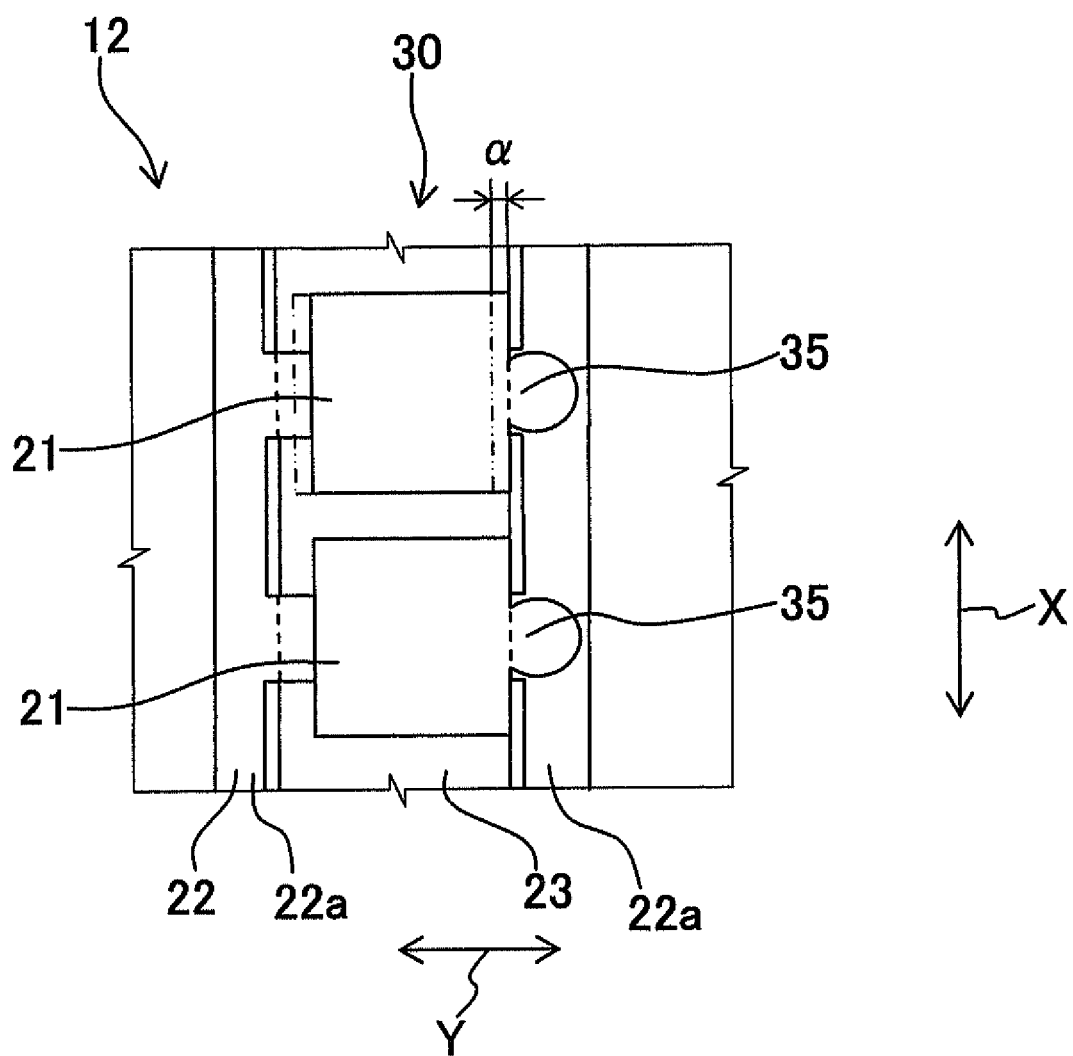
FIG. 7B is a plan view showing a state in which the individual electrode is shifted in Y direction (right side in FIG. 7B) from the regular position (alternate long and short dashes lines)

FIG. 7A is a plan view showing a state in which the individual electrode 21 is shifted to one side in Y direction (left side in FIG. 7A) from a regular position (alternate long and short dashes lines), and FIG. 7B is a plan view showing a state in which the individual electrode 21 is shifted to the other side in Y direction (right side in FIG. 7B) from the regular position (alternate long and short dashes lines). As shown in FIG. 7A, the position shift of the individual electrode 21 to one side in Y direction is allowed until the one end in Y direction (left end in FIG. 7A) of the individual electrode 21 in a plan view overlaps with the one end in Y direction (left end in FIG. 7A) of the second common electrode 23, in other words, up to α μm. Moreover, as shown in FIG. 7B, the position shift to the other side in Y direction of the individual electrode 21 is allowed until the other end in Y direction (right end in FIG. 7B) of the individual electrode 21 in a plan view overlaps with the other end in Y direction (right end in FIG. 7B) of the second common electrode 23, in other words, up to α μm.

Figure 7C:
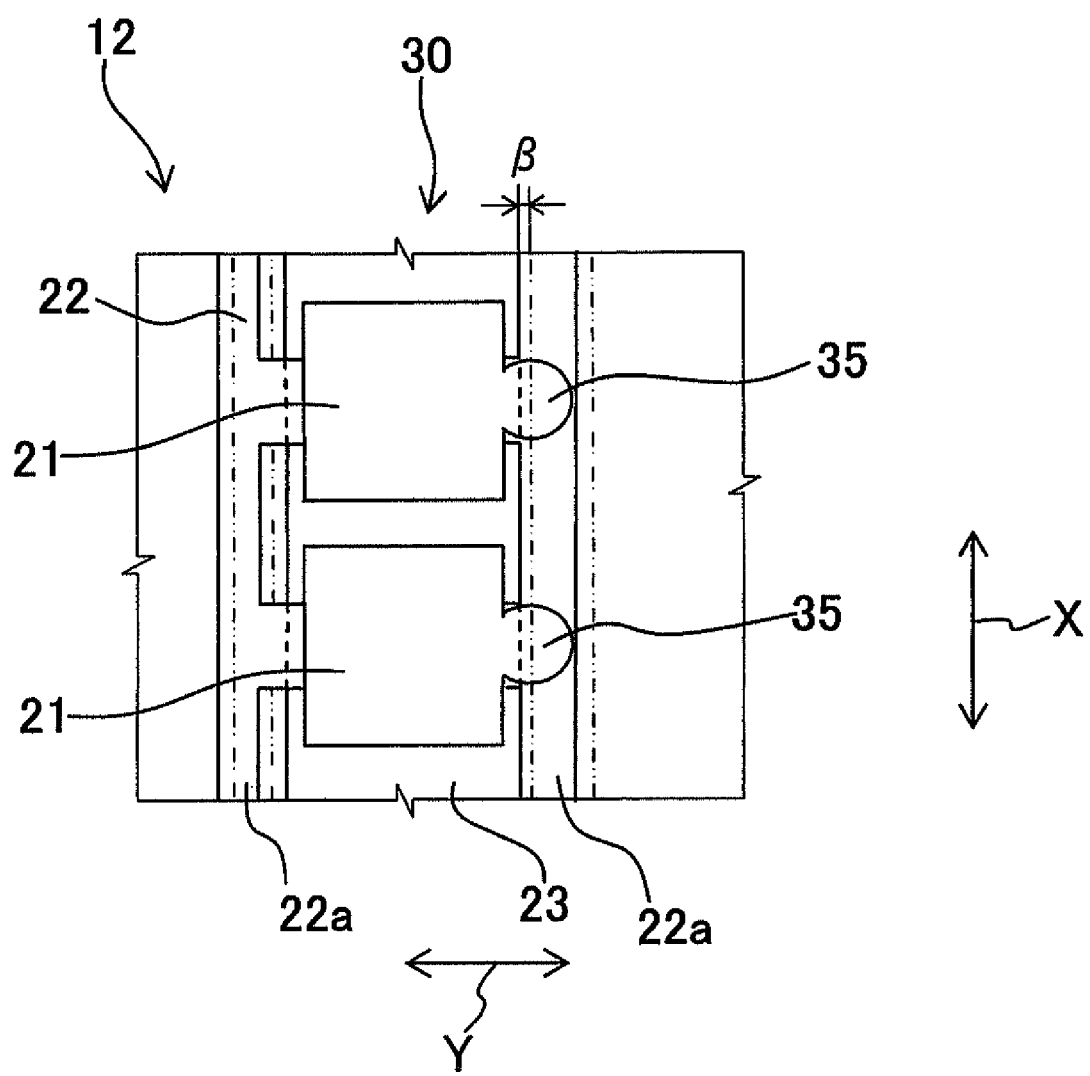
FIG. 7C is a plan view showing a state in which the first common electrode is shifted in Y direction (left side in FIG. 7C) from a regular position (alternate long and short dashes lines)
Figure 7D:
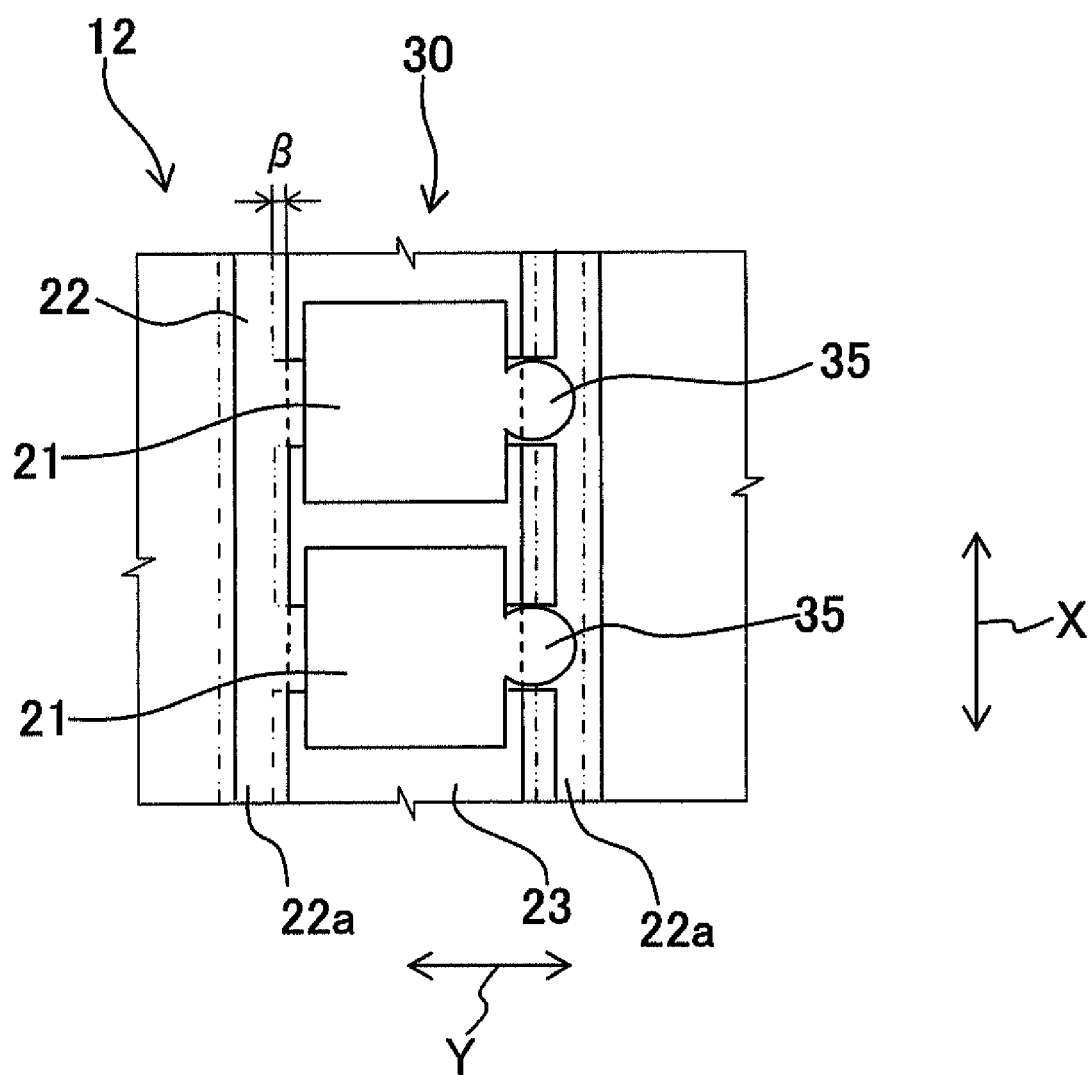
FIG. 7D is a plan view showing a state in which the first common electrode is shifted in Y direction (right side in FIG. 7D) from the regular position (alternate long and short dashes lines)

FIG. 7C is a plan view showing a state in which the first common electrode 22 is shifted to one side in Y direction (left side in FIG. 7C) from a regular position (alternate long and short dashes lines), and FIG. 7D is a plan view showing a state in which the first common electrode 22 is shifted to the other side in Y direction (right side in FIG. 7D) from the regular position (alternate long and short dashes lines). As shown in FIG. 7C, the position shift of the first common electrode 22 to the one side in Y direction is allowed, and an allowable amount is an amount until the one end in Y direction of the first common wire 22a overlaps with the other end in Y direction (right end in FIG. 7C) of the second common electrode 23 in a plan view, in other words, β μm. As shown in FIG. 7D, the position shift to the other side in Y direction of the first common electrode 22 is also allowed, and an allowable amount is an amount until the other end in Y direction of the first common wire 22a overlaps with the one end in Y direction of the second common electrode 23 in a plan view, in other words, β μm. Since it is possible to allow the position shift of the individual electrode 21 with respect to the first electrode 31 and the second electrode 33, it is possible to suppress an occurrence of variation in products due to a portion at which the individual electrode 21 does not partially overlap with the first electrode 31 and the second electrode 33.

In a plan view, the individual electrodes 21, the first electrodes 31, and the second electrodes 33 are arranged such each of the individual electrodes 21, the first electrode 31 corresponding to the individual electrode 21, and the second electrodes 33 corresponding to the individual electrode 21 and the first electrode 31 overlap with each other. However, the first wire 32 and the second wire 34 are arranged not to overlap with each other, and it is possible to suppress a generation of a floating capacitance between the first wire 32 and the second wire 34 when a voltage is applied to the first wire 32 and the second wire 34. Accordingly, it is possible to suppress a generation of heat due to the generation of the floating capacitance, and to suppress an amount of heat generated by the piezoelectric actuator 12.

A first electric potential (positive electric potential such as 20V) and a second electric potential (ground electric potential) different from the first electric potential are applied selectively, from the drive IC 90, to each of the individual electrodes 21 arranged in such manner via the flexible circuit board 13. Moreover, the first electric potential is applied all the time to the first electrode 31 by the driver IC 90, and the second electric potential is applied all the time to the second electrode 33 by the driver IC 90.

A first active portion S1 and a second active portion S2 in the piezoelectric actuator 12 will be described below by referring to FIG. 4. In the piezoelectric actuator 12, portions of the second piezoelectric layer 12b between the individual electrodes 21 and the first electrodes 31 to which the individual electrodes 21 face form the first active portions S1. Moreover, portions, of the first piezoelectric layer 12a and the second piezoelectric layer 12b, at an outer side of the first active portions S1 in a plan view, and between the individual electrodes 21 and the second electrodes 33 to which the individual electrodes 21 face form the second active portions S2. Each of the first active portions S1 is arranged to be associated with each of the pressure chambers 14Aa of the channel unit 11, and is arranged at a substantially central portion in X direction of the corresponding pressure chamber 14Aa. Moreover, each of the second active portions S2 is arranged on both sides in X direction with respect to each of the first active portions S1.

Each of the first active portions S1 is polarized in a direction same as a direction (polarization direction) of an electric field which acts on the first active portion S1 when the second electric potential is applied to the corresponding individual electrode 21 and the first electric potential is applied to the corresponding first electrode 31. On the other hand, each of the second active portions S2 is polarized in a direction same as a direction of an electric field which acts on the second active portion S2 when the first electric potential is applied to the corresponding individual electrode 21 and the second electric potential is applied to the corresponding second electrode 33. In other words, in the first active portion S1 and the second active portion S2, the direction in which the electric field acts is same as the polarization direction.

By polarizing the first active portion S1 and the second active portion S2 in such manner, when the first electric potential is applied to any of the individual electrodes 21 from the driver IC 90, the individual electrode 21 and the corresponding first electrode 31 are at the same electric potential, and an electric field is not generated between the individual electrode 21 and the first electrode 31. Therefore, the first active portion S1 is not expanded and contracted in X direction (a second direction) and in Z direction (a direction perpendicular to X direction and Y direction, first direction), and is not deformed. On the other hand, since the electric potential of the individual electrode 21 and the corresponding second electrode 33 are different from each other, an electric field is generated between the individual electrode 21 and the second electrode 33. When the electric field is generated in such manner, due to a piezoelectric longitudinal effect, the second active portion S2 is expanded in Z direction, and tends to be contracted in X direction. However, since the first piezoelectric layer 12a and the second piezoelectric layer 12b are constrained by the vibration plate 15, the second active portion S2 is deformed to warp in a direction away from the pressure chamber 14Aa. A volume of the pressure chamber 14Aa increases due to this deformation, and it is possible to suck a large amount of ink in the pressure chamber 14Aa from the manifolds 14Da and 14Ea.

On the other hand, when the second electric potential is applied to any of the individual electrodes 21 from the driver IC 90, an electric field in a direction same as the polarization direction acts on the first active portion S1, and due to a piezoelectric transverse effect, the first active portion S1 tends to be expanded in Z direction and contracted in X direction, thereby being deformed to form a projection in a direction toward the pressure chamber 14Aa. However, since there is no effect of the electric field on the vibration plate 15 and the vibration plate 15 is not contracted spontaneously, there is a difference in a distortion in the direction perpendicular to the polarization direction, between the second piezoelectric layer 12b and the vibration plate 15. Due to the difference in the distortion and the vibration plate 15 being fixed to the cavity plate 14A, the second piezoelectric layer 12b and the vibration plate 15 are deformed to form a projection toward the pressure chamber 14Aa (unimorph deformation). Therefore, the volume of the pressure chamber 14Aa is decreased, and a pressure in the pressure chamber 14Aa rises up, and the ink is jetted from the nozzle hole 16a.

At this time, since the individual electrode 21 and the second electrode 33 are at the same electric potential, the second active portion S2 is not deformed in X direction and Z direction, and returns to the original state. Therefore, an effect due to the deformation of the first active portion S1 is cancelled by the second active portion S2 which is formed at a side in X direction of the first active portion S1, and does not reach the adjacent pressure chamber 14Aa, and a cross-talk is suppressed.

Thereafter, when the individual electrode 21 is returned to an electric potential (first electric potential) same as the first electric potential, as it has been described above, the first active portion S1 is not deformed, and the second active portion S2 is deformed to be warped in a direction away from the pressure chamber 14Aa. Accordingly, since the pressure chamber 14Aa returns to original volume, the ink is sucked into the pressure chamber 14Aa from the manifolds 14Da and 14Ea.

The piezoelectric actuator 12 formed in such manner is manufactured by baking after forming the individual electrode 21, the first common electrode 22, and the second common electrode 23 on the first piezoelectric layer 12a, and the second piezoelectric layer 12b. By forming the second electrode wire 23a of the second common electrode 23 which is provided between the vibration plate 15 and the first piezoelectric layer 12a in a stripe form, an area in which the second common electrode 23 is provided is decreased. Therefore, it is possible to suppress the warping of the vibration plate 15 and the first piezoelectric layer 12a which is caused due to a coefficient of linear expansion of the vibration plate 15, the first piezoelectric layer 12a, and the second common electrode 23 at the time of baking, and to reduce a residual stress of the piezoelectric actuator after baking. Moreover, by reducing an area in which the second common electrode 23 is provided, it is possible to reduce an amount of an electrode material to be applied.

Second Embodiment

Figure 8:
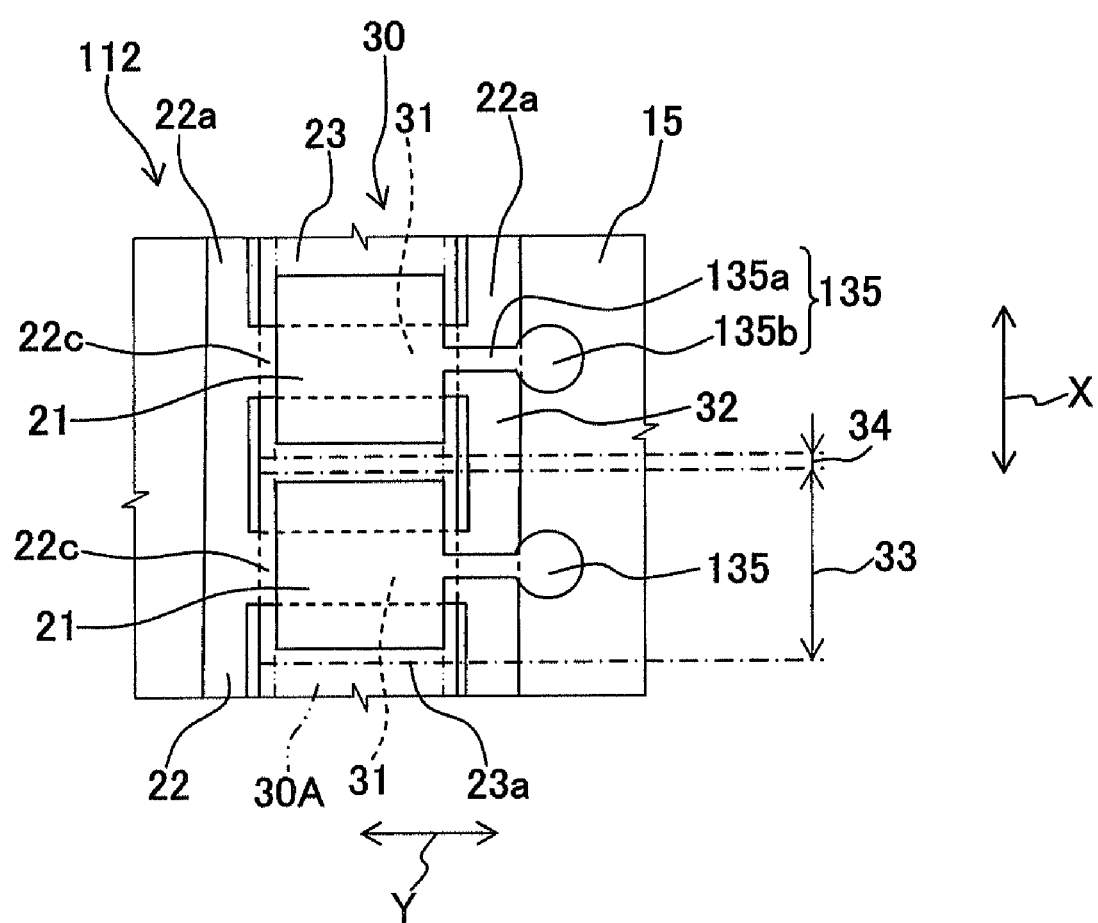
FIG. 8 is an enlarged plan view in which a part of a piezoelectric actuator of a second embodiment is enlarged.

FIG. 8 is an enlarged plan view in which a part of a piezoelectric actuator 112 of a second embodiment is shown in an enlarged form. In FIG. 8, the piezoelectric actuator 112 is shown upon omitting the adjacent individual electrode rows 30. The piezoelectric actuator 112 of the second embodiment is different from the piezoelectric actuator 12 of the first embodiment only at a point that a shape of an individual electrode terminal 135 is different, and the rest of the structure is same. Therefore, only the point of difference in the structure will be described below, and same reference numerals are assigned to the components which are same, and the description thereof is omitted. Each of the individual electrode terminals 135 is formed at a side on one side in Y direction (right side in FIG. 8) of each of the individual electrodes 21 as shown in FIG. 8, and has a terminal portion 135b and an extending portion 135a extending toward one side in Y direction (right side in FIG. 8). The extending portion 135a has one end thereof in Y direction electrically connected to one side in Y direction of the individual electrode 21, and an intermediate portion thereof crossing over the first common wire 22a arranged on one side in Y direction of the individual electrode 21 in a plan view, and the other end arranged on an outer side of the first common wire 22a. The terminal portion 135b which is circular shaped in a plan view is formed at the other end of the extended portion 135a. A plurality of terminals of the flexible circuit board 13 are formed to correspond to the terminal portions 135b respectively, and at the time of adhering the flexible circuit board 13 to the piezoelectric actuator 12, the corresponding terminals are electrically connected to the plurality of individual electrode terminals 135 respectively.

In the piezoelectric actuator 112 formed in such manner, since the individual electrode terminal 135 has an extending portion 135a overlapping with the first wire 32 in a plan view, it is possible to reduce an area in which the individual electrode terminal 135 and the first wire 32 overlap with each other. Accordingly, it is possible to suppress an amount of floating capacitance generated between the individual electrode terminal 135 and the first wire 32. Accordingly, it is possible to suppress an amount of heat generated due to the generation of the floating capacitance, and to suppress the amount of heat generated by the piezoelectric actuator 112.

Third Embodiment

Figure 9:
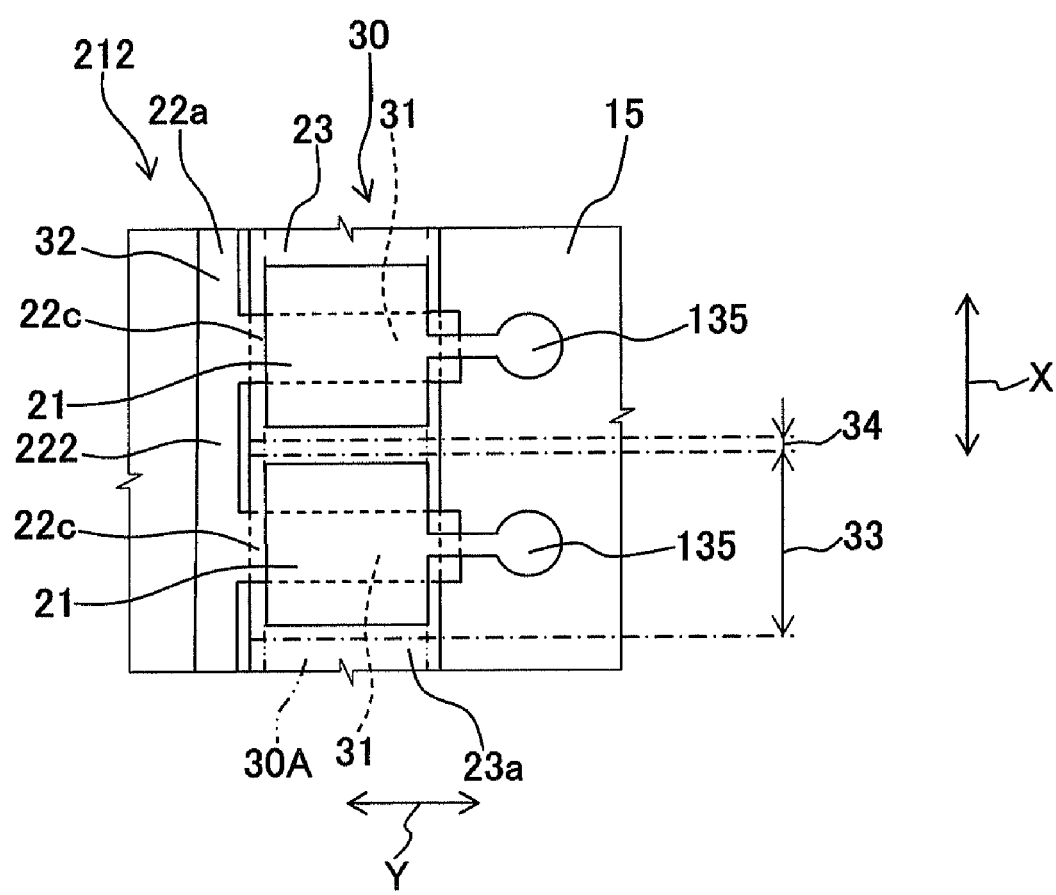
FIG. 9 is an enlarged plan view in which a part of a piezoelectric actuator of a third embodiment is enlarged.

FIG. 9 is an enlarged plan view in which, a part of a piezoelectric actuator 212 of a third embodiment is enlarged.

In FIG. 9 also, the piezoelectric actuator 212 is shown upon omitting the adjacent individual electrode rows 30. The piezoelectric actuator 212 of the third embodiment is different from the piezoelectric actuator 112 of the second embodiment only at a point that a shape of a first common electrode 222 is different, and the rest of the structure is same. Therefore, only the point of difference in the structure will be described below. Same reference numerals are assigned to the components of the rest of the structure which are same, and the description thereof is omitted. In the first common electrode 22 of the first embodiment, each of the first electrodes 31 is electrically connected to two first common wires 22a arranged on both sides of the individual electrode row 30. On the other hand, in the first common electrode 222 of the third embodiment, the first electrode 31 is connected only to the first common wire 22a arranged on any one side of the individual electrode row 30 (in the third embodiment, the first common wire 22a at the other side in Y direction of the individual electrode row 30, and the first common wire 22a on left side of the paper surface in FIG. 9). In other words, in the first common electrode 222, the first common wire 22a is arranged on only one side out of the both sides of the individual electrode row 30.

By forming the first common electrode 22 in such manner, it is possible to form the first common wire 22a on one side in Y direction of the individual electrode row 30 in a plan view away in Y direction from the individual electrode row 30, and to arrange the individual electrode terminal 135 arranged on the other side out of the two sides of the individual electrode row 30 not to overlap with the first common wire 22a. By arranging in such manner, it is possible to suppress the floating capacitance generated between the individual electrode terminal 135 and the first wire 32. Accordingly, it is possible to suppress the heat generated due to the generation of the floating capacitance, and to suppress the amount of heat generated by the piezoelectric actuator 212.

Fourth Embodiment

Figure 10:
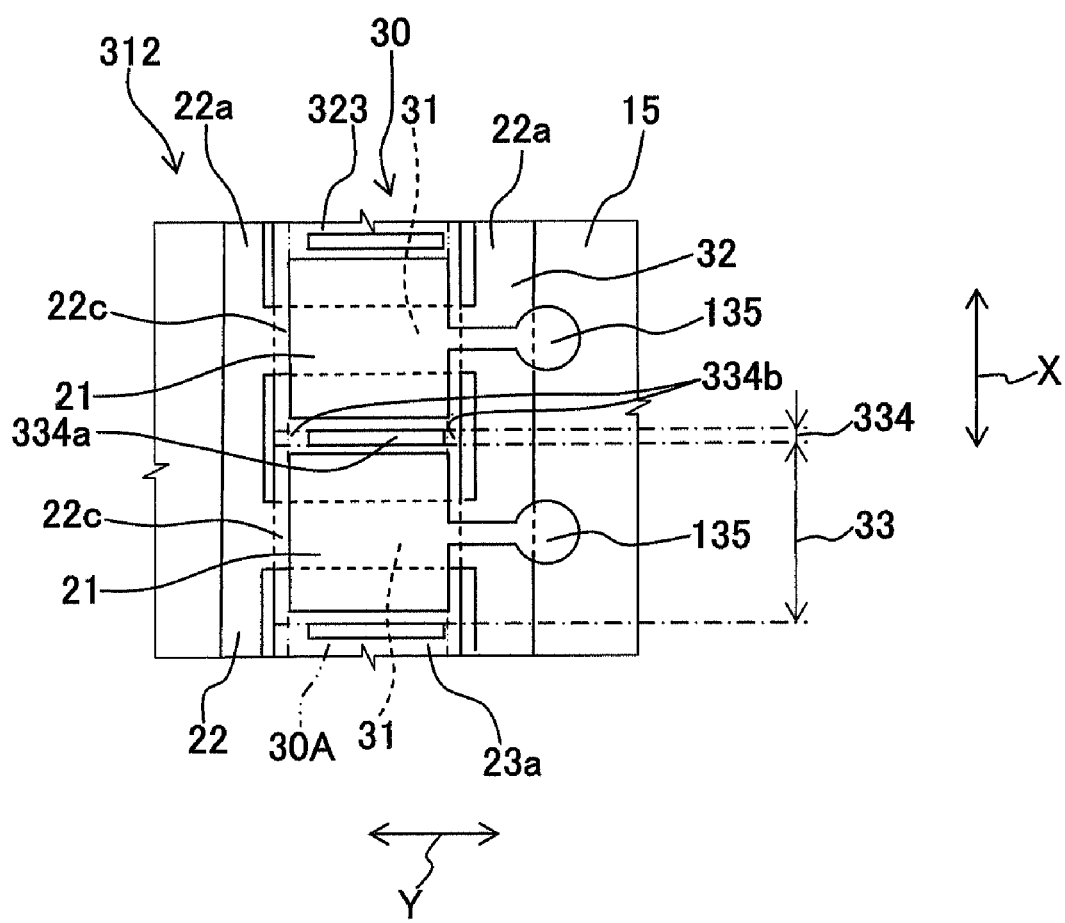
FIG. 10 is an enlarged plan view in which a part of a piezoelectric actuator of a fourth embodiment is enlarged.

FIG. 10 is an enlarged plan view in which a part of a piezoelectric actuator 312 of a fourth embodiment is enlarged. In FIG. 10 also, the piezoelectric actuator 312 is shown upon omitting the adjacent individual electrode rows 30. The piezoelectric actuator 312 of the fourth embodiment is different from the piezoelectric actuator 112 of the second embodiment only at a point that a shape of a second common electrode 323 is different. Concretely, a shape of a second wire 334 is different, and the rest of the structure is same. Same reference numerals are assigned to the components which are same, and the description thereof is omitted. The second wire 334 has a non-electroconductive portion 334a on which an electroconductive member is not applied on an intermediate portion thereof in Y direction. Therefore, a sum of lengths in Y direction (area in Y direction) of two electroconductive portions 334b formed on both sides in Y direction (of Y direction) of the non-electroconductive portion 334a is smaller than a length in Y direction (area in Y direction) of the second electrode 33. By forming in such manner, it is possible to make small an area in which a second common electrode 423 is provided, and to suppress further the warping of the vibration plate 15 and the first piezoelectric layer 12a at the time of baking, and to reduce further the residual stress of the piezoelectric actuator 312 after baking.

Fifth Embodiment

Figure 11:
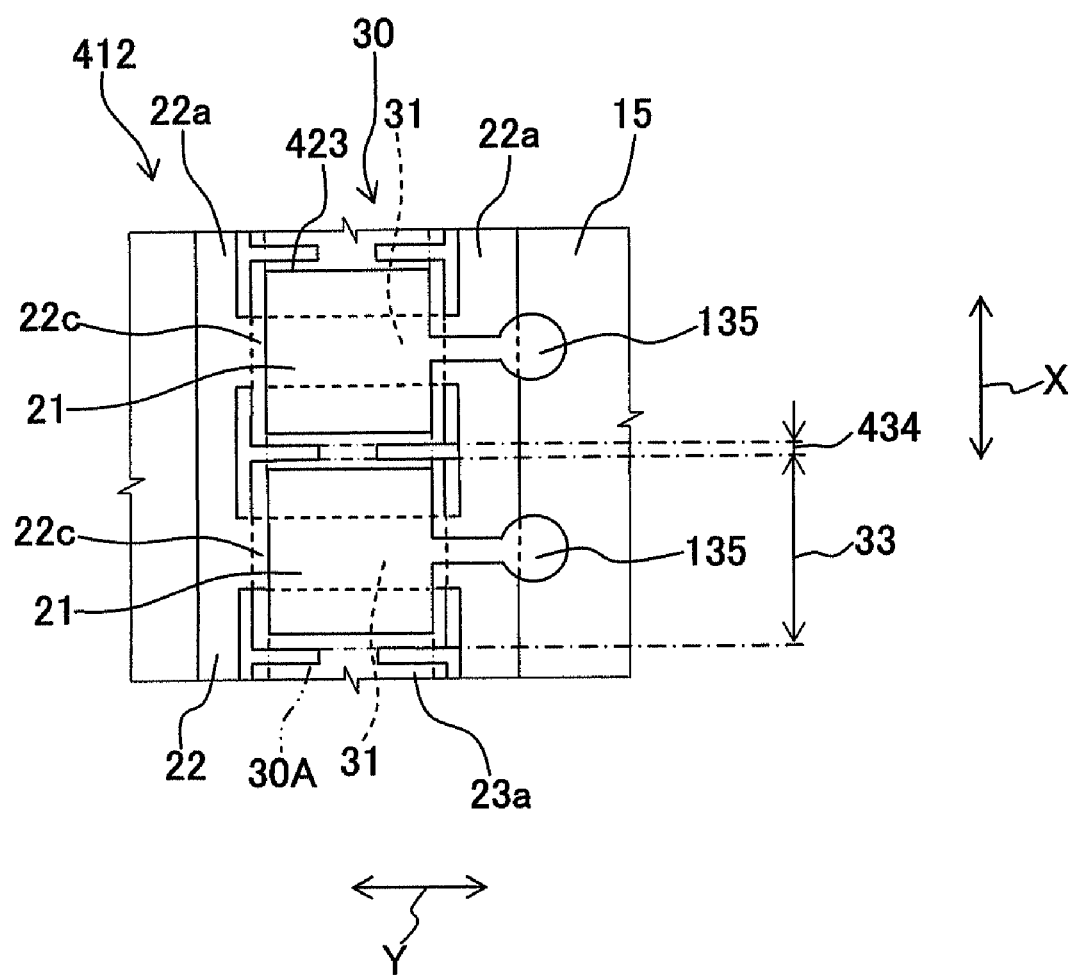
FIG. 11 is an enlarged plan view in which a part of a piezoelectric actuator of a fifth embodiment is enlarged.

FIG. 11 is an enlarged plan view in which a part of a piezoelectric actuator 412 of a fifth embodiment is enlarged.

In FIG. 11 also, the piezoelectric actuator 412 is shown upon omitting the adjacent individual electrode rows 30. The piezoelectric actuator 412 of the fifth embodiment is different from the piezoelectric actuator 112 of the second embodiment only at a point that a shape of a second common electrode 423 is different. Concretely, a shape of a second wire 434 is different, and the rest of the structure is same. Same reference numerals are assigned to the components which are same, and the description thereof is omitted. The second wire 434 has a length in Y direction thereof shorter than a length in Y direction (area in Y direction) of the second electrode 33, and is electrically connected to an intermediate portion in Y direction of the adjacent second electrodes 33 in X direction. By forming in such manner, it is possible to suppress further the warping of the vibration plate 15 and the first piezoelectric layer 12a at the time of baking, and to reduce further the residual stress of the piezoelectric actuator 412 after baking.

Sixth Embodiment

Figure 12:
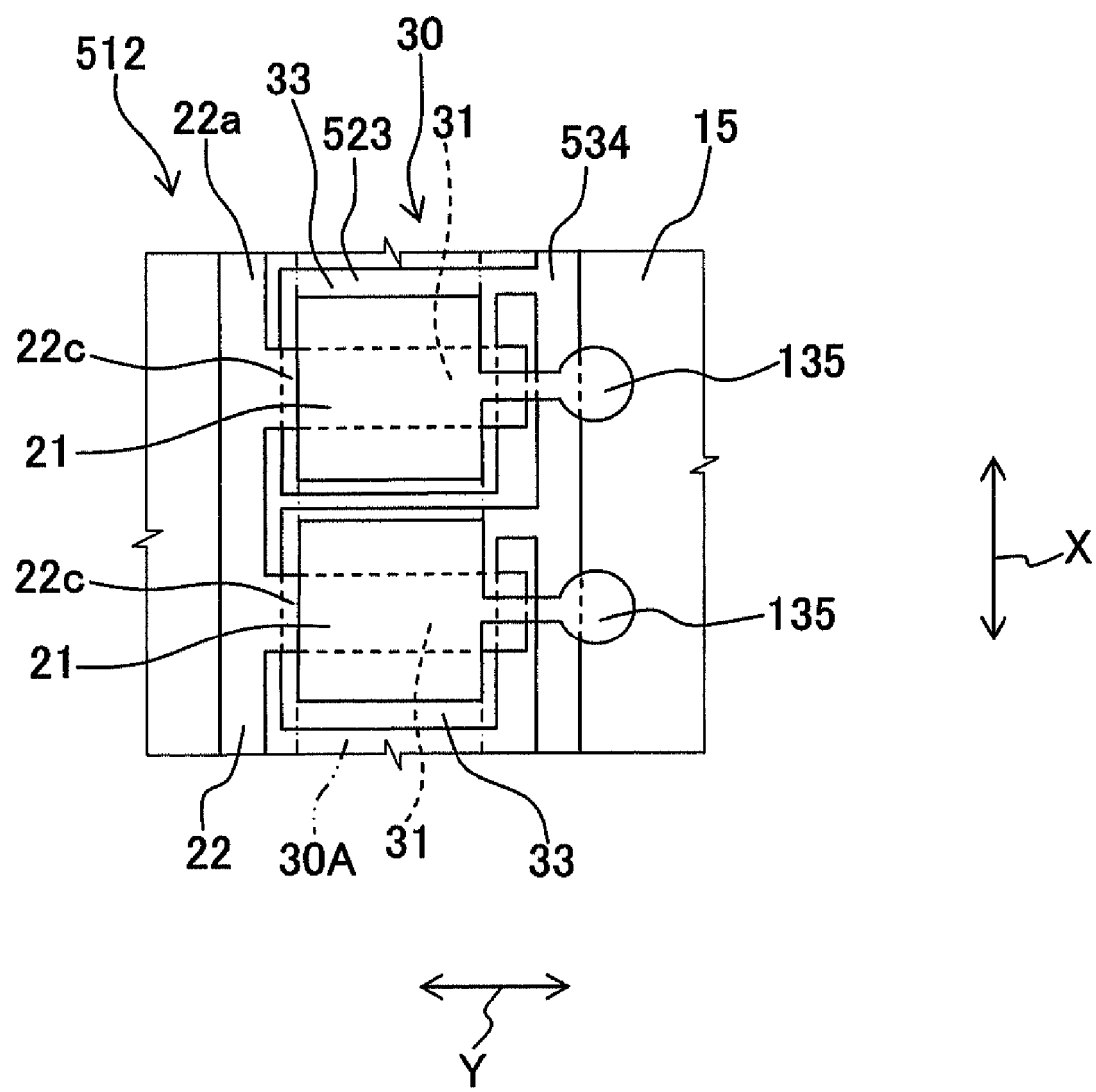
FIG. 12 is an enlarged plan view in which a part of a piezoelectric actuator of a sixth embodiment is enlarged.

FIG. 12 is an enlarged plan view in which a part of a piezoelectric actuator 512 of a sixth embodiment is enlarged. In FIG. 12 also, the piezoelectric actuator 512 is shown upon omitting the adjacent individual electrodes row 30. The piezoelectric actuator 512 of the sixth embodiment is different from the piezoelectric actuator 212 of the third embodiment at a point that a shape of a second common electrode 523 is different. Concretely, a shape of a second wire 534 is different, and the rest of the structure is same. Same reference numerals are assigned to the components which are same, and the description thereof is omitted. Each second wire 534 is arranged corresponding to the other side out of two sides (both sides) of each individual electrode row 30, and is electrically connected to all of the second electrodes 33 in an individual electrode row arrangement area 30A in which the corresponding individual electrode row 30 is formed in a plan view. Even by arranging in such manner, it is possible to arrange such that the first wire 32 and the second wire 534 do not overlap in a plan view, and to suppress the floating capacitance generated between the first wire 32 and the second wire 534. Accordingly, it is possible to suppress the heat generated due to the generation of the floating capacitance, and to suppress the amount of heat generated by the piezoelectric actuator 512.

In this embodiment, the first piezoelectric layer 12a is provided on a surface of the vibration plate 15 on a side not facing the surface on which the cavity plate 14A is provided. However, a diffusion preventive layer which prevents metallic material included in the vibration plate 15 from being diffused to the first piezoelectric layer 12a may be provided between the vibration plate 15 and the first piezoelectric layer 12a.

In the embodiments from the first embodiment to the sixth embodiment, cases in which the piezoelectric actuator of the present invention is applied to the ink-jet head have been described. However, the field of application is not restricted to this. The piezoelectric actuator of the present invention is applicable to any apparatus provided that the apparatus requires a piezoelectric actuator which causes a minute deformation by applying a drive voltage, and by applying the piezoelectric actuator of the present invention to an apparatus such as a micro pump which jets a liquid, it is possible to achieve similar action and effect.

What is claimed is:
1. A piezoelectric actuator comprising:
a vibration plate;
a first piezoelectric layer which is formed on one surface of the vibration plate;
a second piezoelectric layer which is formed on a surface of the first piezoelectric layer, the surface being on a side not facing the vibration plate;
a plurality of individual electrodes which are formed on a surface, of the second piezoelectric layer, on a side not facing the first piezoelectric layer and which are arranged in a predetermined direction;
a first common electrode which is formed between the first piezoelectric layer and the second piezoelectric layer, and which has a plurality of first electrodes arranged in the predetermined direction to face the individual electrodes respectively, and a first wire electrically connecting all of the first electrodes; and
a second common electrode which is formed between the vibration plate and the first piezoelectric layer, and which has a plurality of second electrodes arranged in the predetermined direction to face the individual electrodes respectively, and a second wire electrically connecting all of the second electrodes;
wherein the first wire and the second wire extend in the predetermined direction, and are arranged not to overlap with each other in a stacking direction of the first piezoelectric layer and the second piezoelectric layer.

2. The piezoelectric actuator according to claim 1, wherein each of the first electrodes is formed to be smaller than one of the individual electrodes to which each of the first electrodes faces and to be smaller than one of the second electrodes to which one of the individual electrodes faces, each of the first electrodes being entirely overlapped with one of the second electrodes and one of the individual electrodes in the stacking direction.

3. The piezoelectric actuator according to claim 2, wherein each of the second electrodes is formed to be greater than one of the individual electrodes to which each of the second electrodes faces, and each of the individual electrodes is entirely overlapped with one of the second electrodes in the stacking direction.

4. The piezoelectric actuator according to claim 2, wherein the first wire is arranged not to overlap, in the stacking direction, with an individual electrode arrangement area including individual electrode areas in which the individual electrodes are arranged in the predetermined direction and a connecting area which connects the individual electrode areas in the predetermined direction; and
the second wire is arranged to overlap with the individual electrode arrangement area in the stacking direction.

5. The piezoelectric actuator according to claim 4, further comprising a plurality of individual electrode terminals which are electrically connected to a voltage applying mechanism which applies a voltage selectively to the individual electrodes, and which are electrically connected to the individual electrodes respectively;
wherein the individual electrode terminals are provided on a surface of the second piezoelectric layer, on a side not facing the first piezoelectric layer, at one of side portions, in an orthogonal direction orthogonal to the predetermined direction, of the individual electrode arrangement area; and
the first wire is provided at the other side portion, in the orthogonal direction, of the individual electrode arrangement area.

6. The piezoelectric actuator according to claim 4, wherein in the predetermined direction, an area in which the second electrodes are formed is greater than an area in which the second wire is formed.

7. The piezoelectric actuator according to claim 2, wherein the actuator is electrically connected to a voltage applying mechanism which selectively applies a first electric potential and a second electric potential different from the first electric potential to the individual electrodes, and which applies the first electric potential to the first electrodes via the first wire, and which applies the second electric potential to the second electrodes via the second wire;

wherein in the second piezoelectric layer, portions, each located between one of the individual electrodes and one of the first electrodes to which one of the individual electrodes faces, form first active portions respectively;

in the first piezoelectric layer and the second piezoelectric layer, portions, each located between one of the individual electrodes and one of the second electrodes to which one of the individual electrodes faces form second active portions respectively, the portions not including the first active portions and portions between the first electrodes and the second electrodes; and when the second electric potential is applied to the individual electrodes, the first active portions extend in the stacking direction and are contracted in an orthogonal direction orthogonal to the stacking direction, and when the first electric potential is applied to the individual electrodes, the second active portions extend in the stacking direction and are contracted in the orthogonal direction.

\* \* \* \* \*